United States Patent [19]

Miller

[11] 4,255,707
[45] Mar. 10, 1981

[54] ELECTRICAL ENERGY METER

[75] Inventor: Robert C. Miller, Penn Hills Township, Allegheny County, Pa.

[73] Assignee: Westinghouse Electric Corp., Pittsburgh, Pa.

[21] Appl. No.: 64,603

[22] Filed: Aug. 7, 1979

Related U.S. Application Data

[63] Continuation of Ser. No. 919,874, Jun. 26, 1978, abandoned.

[51] Int. Cl.³ .......................................... G01R 21/00
[52] U.S. Cl. .................................................. 324/142
[58] Field of Search ........................ 324/142; 364/483; 328/151, 158

[56] References Cited

U.S. PATENT DOCUMENTS

| 2,734,396 | 3/1957 | Kaiser et al. | 74/665 B |
| 3,470,471 | 9/1969 | Moore | 324/142 |
| 3,605,014 | 9/1971 | McCracken | 324/102 |
| 3,662,376 | 5/1972 | Furukawa et al. | 340/347 AD |
| 3,665,326 | 5/1972 | Sullivan | 328/151 |
| 3,921,070 | 11/1975 | Ringstad | 324/142 |
| 3,975,682 | 8/1976 | Mayfield | 324/142 |
| 4,055,804 | 10/1977 | Mayfield | 324/142 |
| 4,056,774 | 11/1977 | Shum | 324/142 |
| 4,182,983 | 1/1980 | Heinrich et al. | 324/142 |
| 4,197,582 | 4/1980 | Johnston et al. | 324/142 X |

*Primary Examiner*—Stanley T. Krawczewicz
*Attorney, Agent, or Firm*—D. R. Lackey

[57] ABSTRACT

Method and meter apparatus for measuring parameters of electrical energy quantities occurring in an electrical power distribution system. The meter apparatus samples a second input signal, which is proportional to one of the voltage and current components of an electrical energy quantity, at predetermined instants, which are a function of unit changes in the magnitude of a first input signal, which is proportional to the time integral of one of the voltage and current components of the electrical energy quantity, to provide instantaneous values of said second input signal. Successive ones of the instantaneous magnitudes of the second input signal are converted to signal representations and accumulated to provide totalized values which are equivalent to the time integral of the product of the ones of the electrical energy components being represented by the first and second input signals over a predetermined period of time and which are proportional to a measured parameter occurring on the electrical distribution system.

20 Claims, 13 Drawing Figures

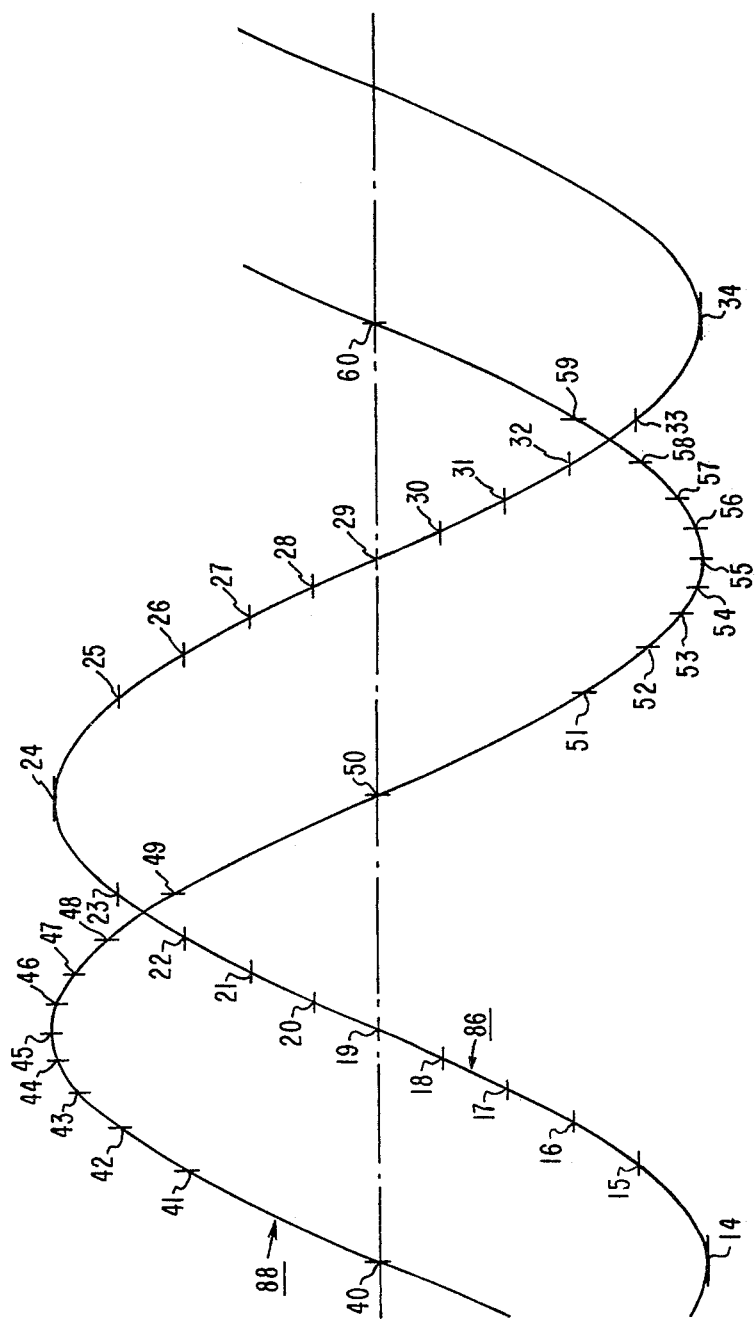

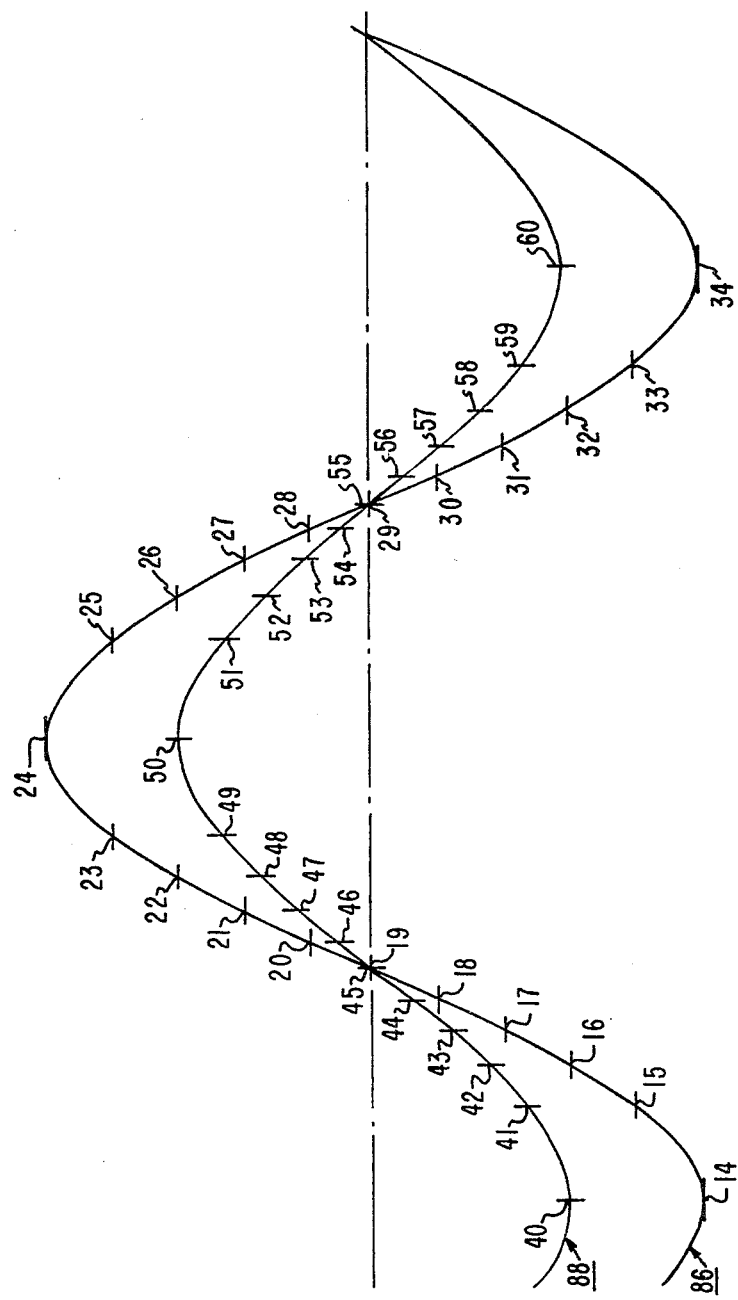

ELECTRICAL ENERGY METER

This is a continuation of application Ser. No. 919,874, filed June 26, 1978, now abandoned.

BACKGROUND OF THE INVENTION

1. Field of the Invention:

This invention relates, in general, to electrical apparatus and, more specifically, to electrical apparatus for measuring electrical energy quantities occurring in an electrical power distribution system.

2. Description of the Prior Art:

In the field of electrical utility power and energy measurement, the amount of electrical power consumed by a load during the time $T_1$ to $T_2$ is determined by the following computation:

$$P = \int_{T_1}^{T_2} ei\, dt$$

where e and i are the instantaneous magnitudes of the voltage and current, respectively, on the electrical power distribution system. The computation consists of time integrating the product of the instantaneous voltage and current.

Presently, the familiar electromechanical induction type watthour meter is used to measure the power consumed by an electrical load. In addition, watthour meters constructed with electronic and solid state devices have also been proposed. These devices employ various analog multiplying circuit techniques in order to compute the product of the voltage and current components of electrical energy. In one electronic power measuring circuit, shown in U.S. Pat. No. 3,764,908, which is assigned to the assignee of the present invention, the voltage and current signals are applied to a semiconductor device having logarithmetic multiplying capabilities which produces the product of the voltage and current signals. Similarly, U.S. Pat. No. 3,864,631, also assigned to the assignee of the present invention, utilizes a conventional analog multiplier circuit.

Another commonly used analog multiplier technique is known as time division multiplication. As shown in U.S. Pat. Nos. 4,056,775 and 3,794,917, a signal proportional to the voltage on the electrical distribution system is sampled to derive a pulse width modulated output signal having a pulse duration proportional to the amplitude of the voltage signal. This output signal controls a gating network which samples a current input signal at a rate proportional to the amplitude of the voltage signal. The resultant output is the product of the voltage and current and consists of a series of pulses having an amplitude proportional to the magnitude of the instantaneous current and a pulse width proportional to the magnitude of the voltage. After the product of the voltage and current signals is obtained, an output signal representative thereof is passed through an integrator to provide an resultant value proportional to the average power consumed by the load. The integrator output is applied to a voltage-to-frequency converter which provides a pulse train wherein each pulse is proportional to the total energy consumed. The pulse train is used to drive mechanical counters, magnetic recorders, or electrical counting circuits and thereby provides an indication of the total electrical power consumed by a load.

It has been found that the analog electronic multiplying techniques are sometimes difficult to apply in order to obtain the desired accuracies. Accurate, drift-free analog multipliers are often expensive and it is difficult to obtain square root computing circuits in the analog circuit field which are sometimes required for calculating electrical power quantities. Also, analog integration circuits required in the analog electronic power measuring apparatus produce undesired drift and variations over longtime intervals. In time division multiplication circuits, it is known that frequency dependent sampling occurs at the multiplier with the associated digital integration also having a similar dependency upon variations of the integrating capacitors.

It has also been proposed to utilize digital processing techniques to measure electrical energy parameters in an electrical distribution system. As shown in U.S. Pat. Nos. 3,569,785 and 3,984,737, the voltage and current signals are sampled at predetermined intervals and the resulting instantaneous values are converted to digital signals. The digital signals are processed by a digital computer which computes certain quantities required for relaying control functions. In U.S. Pat. Nos. 4,077,061 which is assigned to the assignee of the present invention, the voltage and current signals are sampled at random intervals and converted into digital form. The digital signals are then processed by a digital computer which computes the instantaneous values of electrical energy quantities and accumulates the instantaneous values of the computed quantity over a predetermined time interval to provide a measurement of the total watthours, $Q^2$ hours and kilowatt demand by a particular load.

Although large size digital computers having sufficient speed and capacity to compute the necessary product of certain electrical quantities are available, their cost is prohibitive for use in electrical energy measuring apparatus, such as watthour meters. Smaller scale digital computers, while less costly, require many instructions and considerable time to perform the multiplication algorithm necessary to measure certain electrical energy quantities which, thereby, reduces the accuracy of the measuring apparatus below acceptable levels.

Thus, it is desirable to provide a meter apparatus for measuring certain electrical energy quantities occurring in an electrical distribution system which overcomes many of the shortcomings of electronic metering apparatus used in the prior art. It would also be desirable to provide an electrical energy measuring apparatus which retains the advantages of digital processing techniques and, at the same time, provides acceptable reliability and accuracy in measuring certain electrical energy parameters.

SUMMARY OF THE INVENTION

Disclosed herein is a method and meter apparatus for measuring parameters of electrical energy quantities occurring in an electrical power distribution system. The meter apparatus samples a second input signal, which is proportional to one of the voltage and current components of an electrical energy quantity, at predetermined instants, which are a function of unit changes in the magnitude of a first input signal, which is proportional to one of the voltage and current components of the electrical energy quantity, to provide the time integral of instantaneous values of said second input signal. Successive ones of the instantaneous magnitudes of the second input signal are converted to digital signal representations thereof and accumulated over a predetermined interval to provide totalized values which are equivalent to the time integral of the multiplied result of the ones of the component represented by the first and second input signals. The accumulated values are applied to an output device which provides an indication of a measured parameter of electrical energy in the electrical distribution system.

The novel meter apparatus of this invention is adapted to measure electrical energy quantities, such as watthours, VAR hours, $E^2$ hours, and $I^2$ hours. In each instance, the processing of the signals remains the same, with only the appropriate input signals being changed in order to measure the different electrical quantities. In the case of watthours, for example, the first input signal is proportional to the time integral of the voltage or $\int edt$ and the second input signal is proportional to the current drawn by a load with the accumulated value stored in the meter apparatus being proportional to the watthours of electrical energy drawn by the load over a predetermined interval of time.

By sampling the second input signal at predetermined instants, which are a function of unit changes in the magnitude of the first input signal and accumulating successive digital representations of the instantaneous magnitudes of the second input signal at each sampling instant, the time integral of the product of the voltage and load current is effectively computed without the use of the analog multiplying techniques commonly employed in prior art meter apparatus. In addition, the product of the voltage and current is effectively computed without multiplying digital representations of the input signals as is commonly done in meter apparatus utilizing digital processing and calculating techniques; which, thereby, improves the accuracy and reliability of the meter.

BRIEF DESCRIPTION OF THE DRAWING

The various features, advantages and additional uses of this invention will become more apparent by referring to the following detailed description and the accompanying drawing, in which:

FIGS. 1A and 1B are waveforms illustrating the fundamental principles underlying the operation of a meter apparatus constructed according to the teachings of this invention;

DESCRIPTION OF THE PREFERRED EMBODIMENT

1. Fundamental Principles

Figure 2:
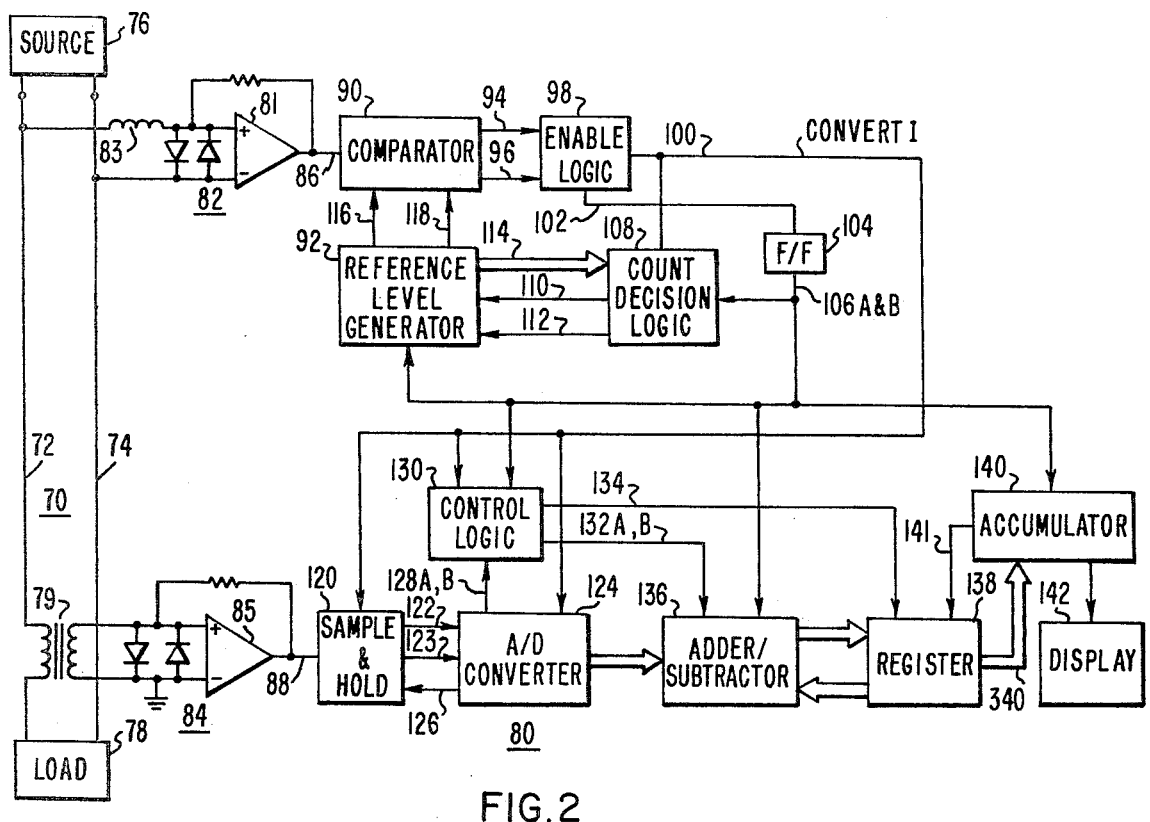
FIG. 2 is a functional block diagram of a meter apparatus constructed according to the preferred embodiment of this invention.

The amount of electrical power consumed by a load in an electrical circuit during the time from $T_1$ to $T_2$ is given by the equation:

$$P = \int_{T_1}^{T_2} eidt$$

where e and i are the instantaneous magnitudes of the voltage and current, respectively, in the electrical circuit. Integrating the product of the instantaneous voltage and current over the predetermined period of time provides the amount of watthours of electrical energy consumed by a load. It is known that if the instantaneous values of $\int edt$ versus i were plotted, the area under the resulting waveform is proportional to the instantaneous watts of energy consumed by a load. The total watthours of energy may then be calculated by summing successive areas over a predetermined period of time.

This invention proposes to effectively calculate this area once per cycle and to sum successive areas over a predetermined period of time to provide a measure of the total watthours of energy consumed by a load.

For a better understanding of this invention, the following discussion relates to the measurement of watthours of electrical energy consumed by a load. It will be understood that other parameters of electrical energy, such as VAR hours, $E^2$ hours and $I^2$ hours, may be measured in the same manner as hereinafter described with only the input signals being changed as required.

Referring now to FIG. 1A, there is shown typical $\int edt$ and current waveforms 86 and 88, respectively, for an electrical power distribution system operating typically at a frequency of 60 Hz. According to the teachings of this invention, the meter apparatus samples a second input signal, which is proportional to one of the voltage and current components of an electrical energy quantity, at predetermined instants, which are a function of unit changes in the magnitude of a first input signal, which is proportional to the time integral of one of the voltage and current components of the electrical energy quantity, to provide instantaneous magnitudes of the second input signal. According to the preferred embodiment of this invention, the unit changes in the magnitude of the $\int edt$ input signal are determined by a plurality of voltage reference levels, the magnitude of which is indicated by reference lines 14 to 34, which are successively generated. Each reference level is an increment of the total magnitude of the edt signal 86 with the difference between successive reference levels being constant. The instantaneous magnitude, which includes both positive and negative values of the $\int edt$ signal 86, is constantly compared with successive ones of the reference levels and an indication or output signal is provided whenever the magnitude of the ∫edt signal 86 crosses, that it exceeds or becomes less than, the magnitude of one of the reference levels. Thus, when the magnitude of the ∫edt signal 86 crosses the magnitude of reference level 16, for example, an output signal will be generated. This output signal, through sampling means described in detail hereafter, causes the instantaneous magnitude of the current signal 88 to be sampled at the instant the ∫edt signal 86 crosses the magnitude of reference level 16. Thus, when the magnitude of the ∫edt signal 86 crosses the magnitude of reference level 16, the instantaneous magnitude of the current signal 88, as indicated by reference number 42, will be sampled and converted into digital signals in the form of binary signal representations of the instantaneous magnitude of the current signal 88. As the time-varying ∫edt signal 86 increases in magnitude beyond the magnitude of reference level 16, successive reference levels, such as reference levels 17, 18, etc., will be generated. Each time that the magnitude of the ∫edt signal 86 crosses the magnitude of one of the reference levels, the instantaneous magnitude of the current signal 88 will be sampled and converted into digital signal form. Successive ones of the digital representations of the instantaneous magnitudes of the current signal 88, which are generated each time the magnitude of the ∫edt signal 86 crosses the magnitude of one of the reference levels, will be accumulated and stored for each cycle of the first or ∫edt signal 86. The total amount of these digital representations of the current signal 88 gives a measure of the instantaneous watts of electrical energy consumed during each cycle of the ∫edt signal 86. Summation of these amounts over a predetermined period of time is equivalent to the computation of the equation $$P = \int_{T_1}^{T_2} eidt$$

over the same period of time and, thereby, measures the total watthours of electrical energy consumed by a load.

In order to provide an accurate indication of watthours consumed by a load, or any other electrical energy quantity, it is necessary to add or subtract the magnitude of the digital signals representing the sampled instantaneous magnitudes of one input signal, such as the current in the case of watthours, depending upon whether the magnitude of the other input signal, the ∫edt signal in the above example, is increasing or decreasing with respect to time.

According to the teachings of this invention, the magnitude of the digital signals representing the instantaneous magnitude of the current at each sampling instant are added to previously stored magnitudes whenever the magnitude of the ∫edt signal is increasing with respect to time. As shown in FIG. 1A, the ∫edt signal 86, which is indicative of the single 60 Hz. frequency, is shifted 90° from the current signal 88 which results from integrating the first input signal 86 with respect to time when the current and voltage on the distribution are in phase. Thus, when the ∫edt signal 86 increases in magnitude, as from reference level 14 to reference level 24, the digital signals representing the instantaneous magnitudes of the current signal 88 at each instant when the instantaneous magnitude of the ∫edt signal 86 crosses the magnitude of one of the reference levels, such as reference level 16, are added to previously stored values. It should be noted that during this time period, the magnitude of the current signal 88 is positive. During the time when the ∫edt signal 86 is decreasing with respect to time and passes through reference levels 25 to 34, the magnitude of the sampled current signal 86 at each sampling instant is subtracted from previous values. However, during this part of the ∫edt cycle, the magnitude of the current signal 88 is negative. Since the subtraction of a negative number is the same as adding a positive number, an accurate indication of the watthours consumed by the load over each cycle of the ∫edt signal 86 is provided. It should also be noted that the current signal 88 is sampled a greater number of times when the magnitude of the current signal is large and contributing more to the watthour measurement than when the magnitude of the current signal 88 is small which improves the accuracy of the watthour measurement.

It is known that when the voltage and current drawn by a load are 90° out of phase there is no net power consumed. In this situation, the 60 Hz. single frequency waveforms of the current and ∫edt input signals, will be in phase, as shown in FIG. 1B. As in the first example shown in FIG. 1A, the magnitude of the current signal 88, at each instant the magnitude of the ∫edt signal 86 crosses the magnitude of one of the reference levels, will be added to previously stored values whenever the magnitude of the ∫edt signal 86 is increasing with respect to time. Thus, during the time period when the ∫edt signal 86 is increasing in magnitude, such as between reference levels 14 and 19, the magnitude of the current signal 88 is negative which causes a negative number to be added to previous values. As the ∫edt signal 86 continues to increase in magnitude from reference level 19 to 24, the magnitude of the current signal 88 is positive which causes a positive number to be added to previous values. However, these positive values are equal to the negative values generated during the first part of the ∫edt signal cycle which thereby gives a zero result and provides the zero power consumed result whenever the voltage and current drawn by a load are 90° out of phase.

2. Functional Operation

Throughout the following description, identical reference numbers refer to the same component shown in all figures of the drawings.

Referring now to FIG. 2, there is shown a functional block diagram of a meter apparatus 80, constructed according to the teachings of this invention, which operates according to the method described above to compute various parameters of electrical energy in an electrical power distribution system. An electrical power distribution system 70 is illustrated and includes power line conductors 72 and 74 which deliver alternating current, typicaly at a frequency of 60 Hz., from a suitable source 76 to a load 78. Although a single phase system is shown, it will be understood that the teachings of this invention are equally applicable to three phase distribution systems as well as systems operating at other than 60 Hz. It is often desirable to measure parameters of electrical energy supplied through a load for billing, load survey, and other analysis for an electrical utility company. These parameters typically include total watthours, $E^2$ hours, $I^2$ hours and VAR hours.

In order to measure the components of electrical energy on an electrical distribution system, suitable input devices are connected to distribution system 70 to provide appropriate signals to the meter apparatus 80. Thus, input devices 82 and 84 are connected to the distribution system conductors 72 and 74 in order to provide the respective ∫edt and current signals 86 and 88, respectively to the meter apparatus 80 to measure watthours of electrical energy consumed by the load 78. For clarity, the functional description and operation of the meter apparatus 80 will be described in conjunction with a measurement of watthours of electrical energy consumed by the load 78. When other parameters, such as VAR hours, $E^2$ hours and $I^2$ hours, of electrical energy are to be measured, the appropriate input devices, as described hereafter, would be used in place of the input devices 82 and 84 in order to provide the necessary components of electrical energy on the distribution system 70 to the meter apparatus 80.

Thus, in order to provide the voltage and current components of electrical energy necessary to measure the watthours of power consumed by the load 78 over a period of time, the input device 82 includes an amplifier 81 having its non-inverting (+) input connected through inductor 83 to distribution network conductor 72 and its inverting input (−) connected to conductor 74. The amplifier 81 provides a first signal 86 which is proportional to ∫edt. Although an inductor 83 is illustrated, other integrating means, including an amplifier arranged in a conventional integrating configuration, may be used to obtain the time integral of the voltage. The current component is provided by input device 84 which includes operational amplifier 85 having its non-inverting (+) and inverting input (−) inputs connected across the secondary winding of a current transformer 79. Amplifier 85 thus provides a voltage signal 88 which is proporational to the current drawn by the load 78 on the distribution network 70. Diodes are connected between the inputs of both amplifiers 81 and 85 to provide voltage surge protection.

As shown in FIG. 2, the first input signal 86 is inputted to a comparator circuit 90. The comparator circuit 90 compares the instantaneous magnitude of the first input signal 86 with successive ones of the reference level voltages generated by reference level generator 92 and provides an output whenever the instantaneous magnitude of the first signal 86 crosses the magnitude of one of the reference level voltages. The term "crosses" will be understood to mean the instant when the magnitude of the ∫edt signal 86 exceeds the magnitude of one of the reference levels when ∫edt signal is increasing in magnitude and also, when the magnitude of the ∫edt signal 86 becomes less than the magnitdue of one of the reference levels when the magnitude of the ∫edt signal 86 is decreasing with respect to time. This output signal is transmitted by conductor 94, whenever the magnitude of the first input signal 86 is increasing with respect to time and by conductor 96 whenever the magnitude of the first input signal 86 is decreasing with respect to time, to the enable logic circuit 98. The enable logic 98 generates an output pulse on conductor 100, labeled CONVERT I, which initiates the sampling of the second or current signal 88. In addition, the enable logic 98 generates appropriate control signals, indicated by reference number 102, for the flip-flop circuitry 104. The control signals 102 cause the flip-flop circuitry 104 to generate control signals 106A and 106B indicating whether the first input signal 86 is increasing or decreasing in magnitude with respect to time. Control signals 106A and 106B are inputted to the count decision logic 108 to generate the next reference level voltages and also to control the adding or subtracting of the instantaneous magnitude of the sampled current of second input signal 88 to previously stored values. The count decision logic 108 combines the control signals from the flip-flop circuitry 104 with the present output of the reference level generator 92 carried on data bus 114 to generate a count-up signal 110 when the magnitude of the voltage is increasing with respect to time and a count-down signal 112 when the magnitude of the voltage is decreasing with respect to time.

The reference level generator 92 includes circuitry that generates successive reference level voltages which are associated with the instantaneous magnitude of the ∫edt or first input signal 86. The reference level generator 92 is designed to produce two reference level voltages which have a predetermined voltage difference therebetween so as to effectively bracket the instantaneous magnitude of the ∫edt or first input signal 86. Upon receiving a count-up pulse 110 from the count decision logic 108, the reference level generator 92 will provide two new reference voltage levels on control lines 116 and 118 to the comparator 90 which are each one increment or voltage difference greater than the preceding reference level voltages. Upon receiving a count-down signal 112, the reference level generator 92 will similarly generate two new reference level voltages which are each one increment in magnitude less than the preceding reference level voltages. In this manner, the reference level generator 92 tracks or follows the time-varying first input signal 86. In addition, the reference level generator 92 includes circuitry which changes the magnitude of the reference level voltages by a predetermined amount, which is an increment of the difference between successive reference level voltages, at appropriate intervals. According to the preferred embodiment of this invention, the reference level voltages are offset every time the magnitude of the first input signal 86 reaches a positive peak as indicated by control signal 106A from the flip-flop logic 104. When control signal 106A is received by the reference level generator 92, the reference level voltages generated during the next cycle of the ∫edt signal 86 will have a magnitude equal to the same magnitude as the corresponding reference level in the preceding cycle of a first input signal 86 plus 1/16 of the voltage difference between successive reference levels. In this manner, the sampling of the second input signal 88 is optimized over a period of time which enables the sampling rate to be reduced without affecting the overall accuracy of the meter 80 and, further, enables less expensive components to be utilized thereby reducing the overall cost of the meter apparatus 80.

As described previously, a CONVERT I signal 100 will be generated by the enable logic 98 whenever the instantaneous magnitude of the first input signal 86 crosses one of the reference level voltages. The CONVERT I signal 100 is inputted to a sample and hold circuit 120 which causes the instantaneous magnitude of the second input signal 88 to be sampled and held at the instant the magnitude of the first input signal 86 crosses one of the reference level voltages. The output 122 of the samples and hold circuitry 120, which is the instantaneous magnitude of the current second input signal 88 at the sampling instant, is inputted to an A/D converter circuit 124 which through a successive approximation technique, converts the analog second input signal 88 into a digital signal representative of the instantaneous magnitude of the second input signal 88 at the sampling instant. At the end of the conversion, the A/D converter circuit 124 transmits an end of conversion signal 126 to the sample and hold circuit 120 which sets up the sample and hold circuit 120 for the next sampling period. In addition, the A/D converter 124 transmits appropriate control signals 128 to the control logic 130 at the end of the conversion of the second input signal 88 which indicates that a complete digital signal is ready for subsequent processing. The control logic 130 generates appropriate control signals 132A, 132B and 134 which control the transfer of the digital word from the A/D converter 124 to the adder/subtractor logic 136 and register 138. In conjunction with the add and subtract signals 106A and 106B from the flip-flop logic 104, the adder/subtractor logic 136, under the control of the control logic signals 132A and 132B, causes the digital signal representations of the instantaneous magnitude of the second input signal 88 to be added to previously stored values in the register 138 whenever the magnitude of the first input signal 86 is increasing with respect to time or subtracted from the stored values in the register 138 whenever the magnitude of the first input signal 86 is decreasing with respect to time to provide a true indication of the total power consumed by the load over a period of time. The register 138 accumulates successive ones of the digital representations of the sampled second input signal 88 during each cycle of the first input signal 86. These accumulated values are transferred to an accumulator 140 whenever the first input signal 86 reaches a positive peak. The accumulator 140, which may be any suitable counting or data storage device, thus contains totalized values of the measured parameter of electrical energy for a predetermined period of time. These totalized values may be transmitted to a suitabe display 142, such as an electro-mechanical or LED readout, to provide a visible indication of the magnitude of the measured parameter of electrical energy.

3. Specific Circuitry

Figure 3:
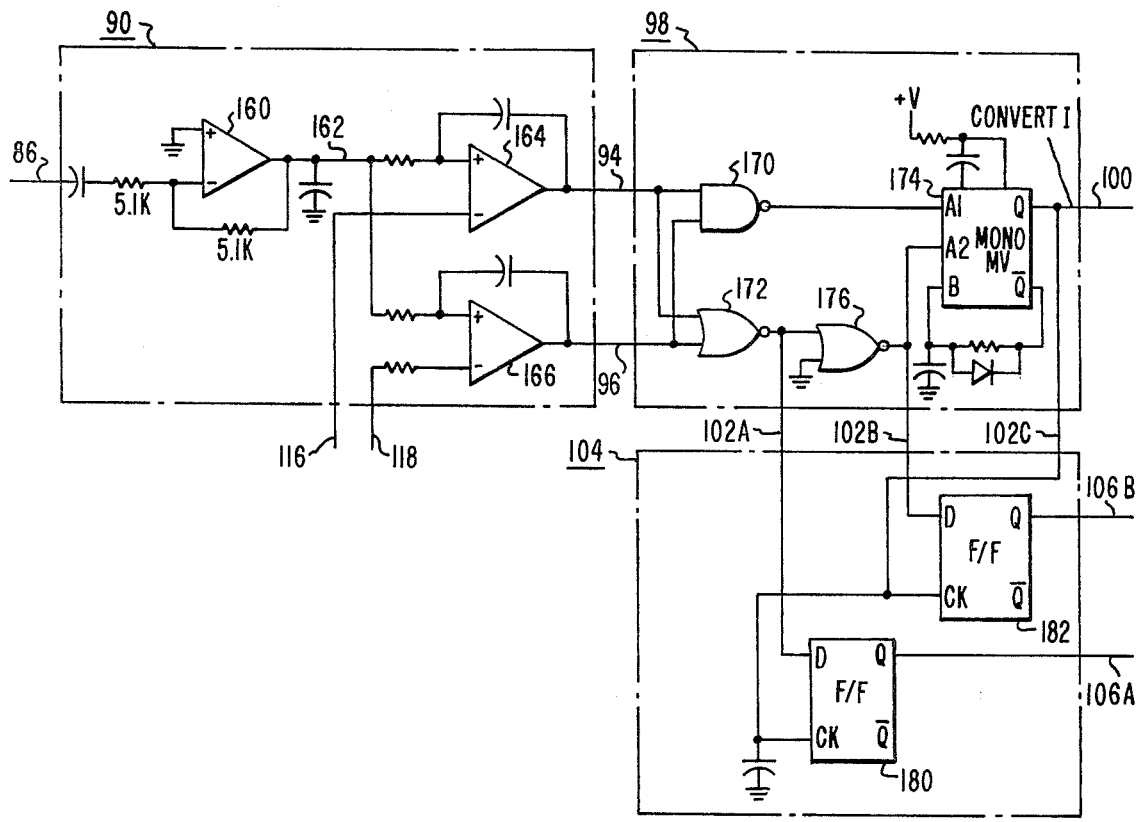
FIG. 3 is a schematic circuit diagram of the comparator, enable and flip-flop logic sections shown in FIG. 2.

Referring to FIG. 3, there is shown the detailed schematic circuitry of the comparator 90, enable logic 98 and flip-flop logic 104 sections shown in FIG. 2. The comparator logic 90 includes input operational amplifier 160 and first and second comparators 164 and 166, respectively. The first or ∫edt input signal 86 is connected to the inverting (−) input terminal of operational amplifier 160 which is arranged in a conventional inverting amplifier configuration and has its non-inverting (+) input terminal connected to ground. Thus, the output voltage 162 from the operational amplifier 160 is inverted from the magnitude of the first input signal 86. The output signal 162 from the operational amplifier 160 is applied to the non-inverting (+) input terminal of comparators 164 and 166. The comparator logic 90 also receives first and second reference level voltages on control lines 116 and 118, respectively, from the reference level generator 92. The first reference level voltage on control line 116 is applied to the inverting (−) input terminal of comparator 164; while the second reference level voltage on control line 118 is applied to the inverting (−) input terminal of comparator 166. The comparators 164 and 166 will, respectively, provide a positive going or logic one output signal 94 o4 96, respectively, whenever the voltage from the operational amplifier 160 present at the respective non-inverting (+) input terminals of the comparators 164 and 166 is greater than the reference level voltages applied to the respective inverting (−) input terminals.

Figure 5:
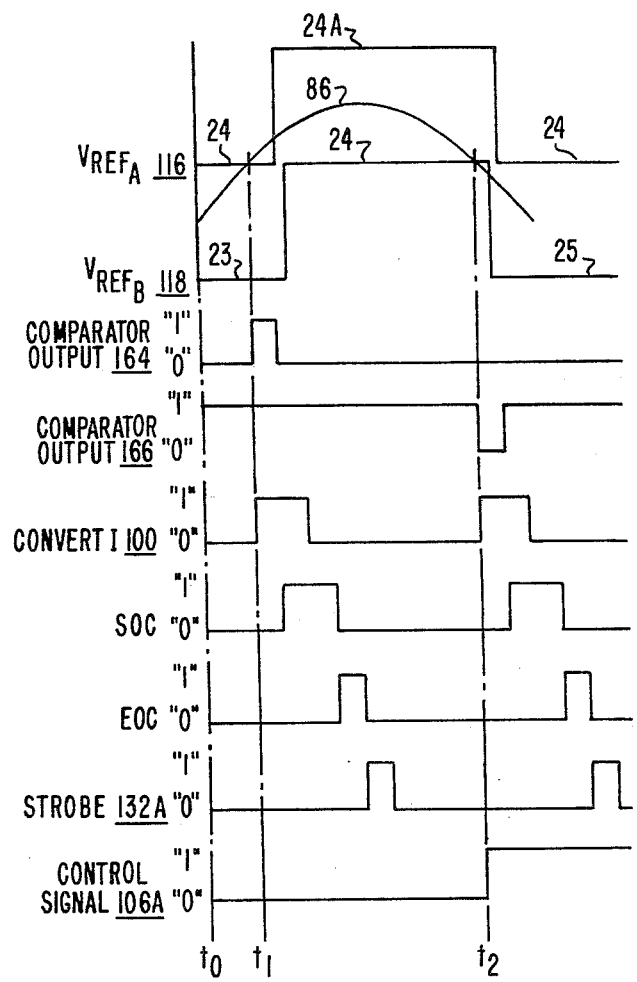
FIG. 5 is a waveform illustrating the operation of the circuits of FIGS. 3, 4 and 7.

Referring to FIG. 5, there are shown waveforms which are useful in explaining the operation of the comparator logic 90. For example purposes, the instantaneous magnitude of the ∫edt or first input signal 86 is chosen to be near its peak magnitude at time ($t_O$). At this time, the reference level generator 92 will output a first reference level voltage on control line 116 to comparator 164 which is greater than the magnitude of the first input signal 86 at time $t_O$. In addition, the reference level generator 92 supplies a second reference level voltage on control line 118 to comparator 166 which is less than the magnitude of the first input signal 86 at time $t_O$. The first and second reference level voltages 116 and 118 are a predetermined potential apart and thereby bracket the instantaneous magnitude of the first input signal 86. Since, at time $t_O$, as shown in FIG. 5, the instantaneous magnitude of the first input signal 86 is greater than the second reference voltage level 118 and less than the first reference voltage 116, comparator 164 will be providing a zero output while comparator 166 will be producing a positive or logic one output. When the instantaneous magnitude of the first input signal 86 crosses the magnitude of the first reference level voltage 116, as as time $t_1$, the output 94 of comparator 164 changes state from logic zero to logic one as shown in FIG. 5. At this point, the reference level generator 92 will generate new reference level voltages, as described hereafter. Since the magnitude of the first input signal 86 is increasing with respect to time, the reference level generator 92 will increment the first reference level voltage by a predetermined amount to the magnitude indicated by reference number 24A and also increment the second reference level voltage by the same predetermind amount to a magnitude indicated by reference number 24. In this manner, the reference level voltage 116 and 118 are adjusted to again bracket the instantaneous magnitude of the first input signal 86 which causes the output 94 of comparator 164 to change states from logic one to logic zero. After the magnitude of the first input signal 86 reaches its peak and begins to decrease with respect to time, the magnitude of the first input signal 86 will drop below the magnitude 28 of the second reference level voltage as indicated at time ($t_2$). At this time, the magnitude of the second reference level voltage 118 is greater than the instantaneous magnitude of the first input signal 86 which causes the output of the comparator 166 to switch from a logic one to a logic zero state. Subsequent decrementing of the first and second reference level voltages by the reference level generator 92 in the manner described above will result in the first and second reference level voltages having magnitudes indicated by reference numerals 24 and 25, respectively. Since the magnitude of the first input signal 86 is again greater than the magnitude 25 of the second reference level voltage, the output 96 of comparator 166 will switch back to a logic one state.

Referring again to FIG. 3, the outputs 94 and 96 of comparators 164 and 166 are inputs to the enable logic 98 and are connected as parallel inputs to NAND gate 170 and NOR gate 172. The output of NAND gate 170 is connected to the A1 input of a monostable multivibrator 174 which includes suitable resistors and capacitors to provide an output signal having a well-defined output pulse width upon triggering. The output of NOR gate 172 is connected through NOR gate 176 to the A2 input of multivibrator 174. An output pulse, labeled CONVERT I, indicated by reference 100, is generated at the non-inverting output of multivibrator 174 when either or both of the A1 and A2 inputs switch from a logic one to a logic zero state. Thus, when the instantaneous magnitude of the first ∫edt input signal 86 exceeds the magnitude of the first reference level voltage 116, as shown at time (t₁) in FIG. 5, the outputs 94 and 96 of comparators 164 and 166 will both be at a logic one state which causes the output of NAND gate 170 to go to a logic zero thereby triggering multivibrator 174. Upon triggering, multivibrator 174 generates the CONVERT I signal 100 as shown in FIGS. 3 and 5. Whenever the magnitude of the first input signal 86 drops below the magnitude of the second reference level voltage, such as at time (t₂) in FIG. 5, the outputs 94 and 96 of comparators 164 and 166 will be at a logic zero state. Since a logic zero is at both of its inputs, the output of NOR gate 172 changes to a logic one which, through NOR gate 176, causes the A2 input of multivibrator 174 to go to a logic zero, again triggering the multivibrator 174 and generating the CONVERT I 100 signal.

The outputs 102A and 102B of NOR gates 172 and 176 are respectively connected to the inputs of flip-flops 180 and 182 in flip-flop logic circuit 104. The non-inverting output of multivibrator 174 is connected to the clock input of flip-flops 180 and 182 to cause the outputs of flip-flops 180 and 182 to switch to the logic state present at the respective D inputs whenever multivibrator 174 is triggered in the manner described above. Flip-flops 180 and 182 thereby provide output signals 106A and 106B, respectively, which cause the reference level generator 92 to increment the magnitudes of the first and second reference level voltages 116 and 118 whenever the ∫edt input 86 is increasing in magnitude with respect to time and to decrement the magnitudes of the reference level voltages 116 and 118 whenever the magnitude of the ∫edt input signal 86 is decreasing with respect to time as well as controlling the addition or subtraction of the instantaneous magnitude of the second or current input signal 88 from the previously stored values as described hereinbelow.

Figure 4:
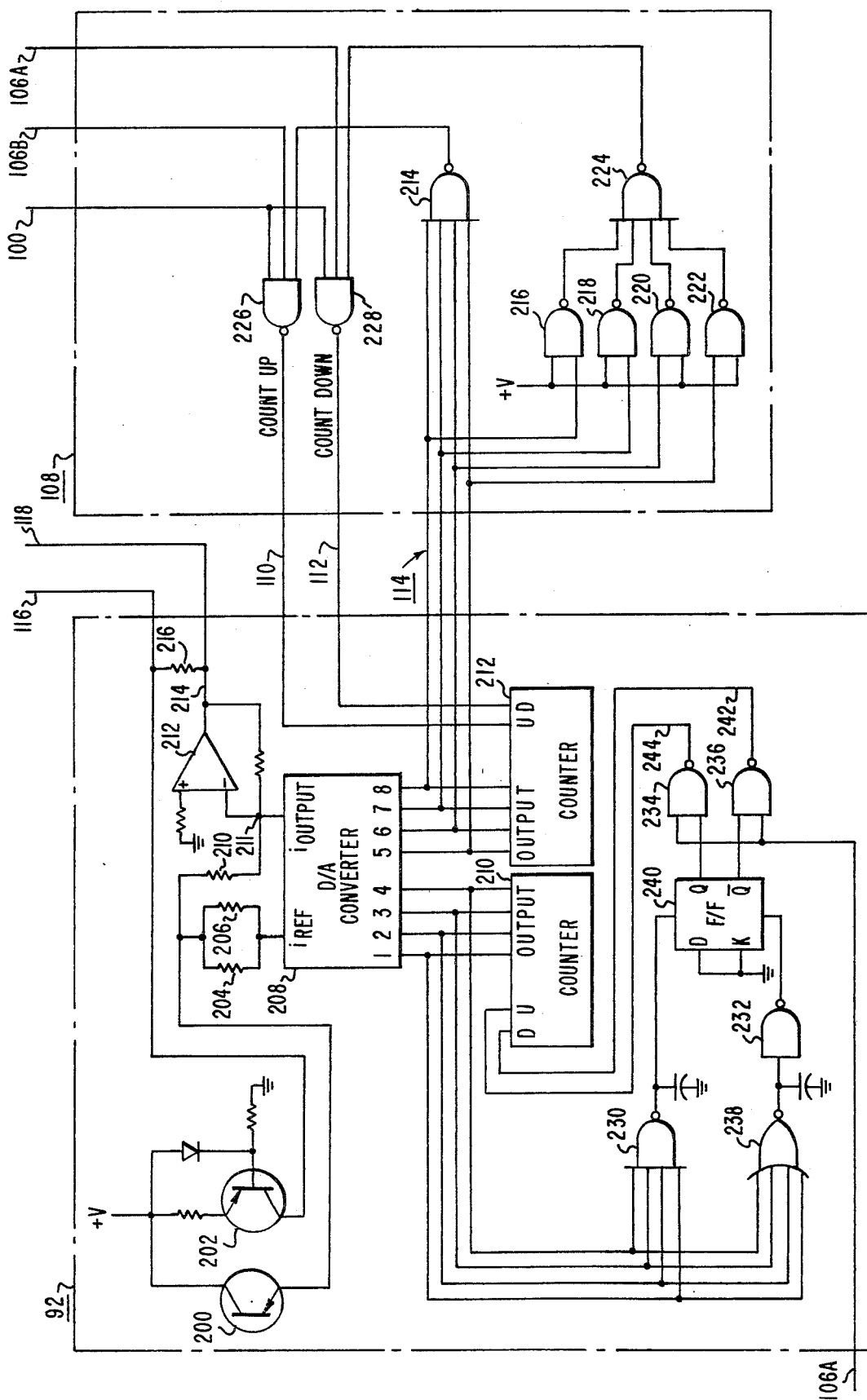
FIG. 4 is a schematic circuit diagram of the reference level generator and count decision logic circuits shown in FIG. 2.

Referring now to FIG. 4, there is shown detailed schematic circuits of the reference level generator 92 and the count decision logic 108 shown in FIG. 2 which interact to provide the plurality of successive reference level voltages to the comparator logic 90. The reference level generator 92 includes suitably biased transistors 200 and 202 which are connected as constant current sources. Transistor 200 provides a reference current through resistors 204 and 206 to the reference current input of D/A converter 208 and an offset current through resistor 210 to summing junction 211. The offset current, which is negative in magnitude, is summed at junction 211 with the output current from D/A converter 208 and causes the normal zero to positive current output of the D/A converter 208 to be offset and swing from negative to positive current values within its range. Summing junction 211 is connected to the inverting (−) input of operational amplifier 212 which is connected in a conventional inverting configuration with its non-inverting input (+) connected through a resistor to ground. Transistor 202 produces a base current which through resistor 216 and the output voltage of amplifier 212 provides two reference level voltages on lines 116 and 118 which are a predetermined increment or voltage apart, as provided by the voltage drop across resistor 216.

The reference level generator 92 further includes a digital-to-analog converter 208. This device, which may be of any standard type, such as Model No. MC1408 sold by Motorola Semiconductor Products, Inc., Phoenix, Arizona, produces an output current which is the produce of an input reference current and a fraction which is the eight bit digital input word divided by the total range of the device. The eight-bit digital input word to the D/A converter 208 is formed from the output of two four-bit counters 210 and 212, with the outputs of counter 210 connected to the first four or least significant bit inputs of the D/A converter 208 and the outputs of counter 212 connected to the upper four or most significant bit inputs of the D/A converter 208. The D/A converter 208 multiplies the fraction of the eight-bit digital word received at its input divided by the total range of the device by the input reference current as described above, to provide multiple increments of output current a its output terminal. The output terminal is connected to the summing junction 211 and the inverting (−) input terminal of operational amplifier 212 and thereby causes the output 214 of the operational amplifier 212 to vary incrementally with the varying eight-bit input word to the D/A converter 208 and thereby provide the plurality of successive reference level voltages on lines 116 and 118.

The four most significant bits of the eight-bit digital input word to the D/A converter 208 are changed in response to control signals from the count decision logic circuitry 108 shown in FIG. 4. The outputs of counter 212, which are also the inputs to the most significant bits of the D/A converter 208, are combined in NAND gate 214 and a gating network comprising NAND gates 216, 218, 220, 222, and 224. The output of NAND gate 214 is an input to NAND gate 226 along with control signal 106B from the output of flip-flop 182 which is generated when the instantaneous magnitude of the first input signal 86 is increasing with respect to time. The third input to NAND gate 226 is control signal 100 from multivibrator 174. When all of the inputs to NAND gate 226 are in a logic one state, NAND gate 226 will generate an output signal, labeled COUNT-UP, to the up input of counter 212 which causes the output of counter 212 to be incremented by one thereby incrementing the four most significant bits of the input word to the D/A converter 208. NAND gate 214 acts as an inhibit in that when counter 212 reaches its maximum count, as evidenced by all four inputs to NAND 214 being in a logic one state, the output of NAND 214 switches to a logic zero which maintains the output of NAND 226 at a logic one thereby preventing counter 212 from overflowing to zero on the next count pulse. Similarly, the outputs of counter 212 are combined in the gating network formed by NAND gates 216, 218, 220, 222, and 224 such that an output signal will be generated by NAND gate 224 when the minimum count of zero is reached by counter 212 which inhibits overflow of counter 212 on the subsequent count pulse. The output of NAND gate 224 is an input to NAND gate 228 along with control signal 106A from flip-flop 180 and control signal 100 from multivibrator 174. NAND gate 228 will generate a control signal, labeled COUNT-DOWN, when the magnitude of the first input signal 86 is decreasing with respect to time. The COUNT-DOWN signal is connected to the down input of counter 212 which causes counter 212 to be decremented by one each time the first input signal 86 crosses one of the reference level voltages. In this manner, counter 212 is incremented or decremented to provide a maximum of sixteen different binary number inputs to the D/A converter 208 which converts the digital input word into varying, incremental output signals to form the successive reference level voltages.

It should be noted that the output of counter 212 through the D/A converter 208 causes the magnitude of the various reference level voltages to be the same between successive cycles of the first input signal 86. Due to the relatively slow sampling rate of the A/D converter used to sample the instantaneous magnitude of the current or second input signal 88, various errors are introduced in the measurement of a parameter of electrical energy. Although it is possible to utilize A/D converters having higher sampling rates, the cost of such components is prohibitive. In order to utilize less expensive A/D converters and at the same time maintain acceptable accuracy levels in the measurement of electrical energy quantities, the preferred embodiment of this invention proposes to increment the magnitude of corresponding reference level voltages at predetermined intervals. Accordingly, the reference level voltages are incremented by a predetermined amount every time the first input signal 86 reaches a peak or maximum positive magnitude. At the detection of a peak in the first input signal 86, the magnitude of the reference level voltage is adjuted by 1/16th of the difference between successive reference level voltages. Thus, after sixteen cycles (approximately ¼th of a second at 60 Hz.) the first input signal 86 has been sliced into a maximum of 256 different increments (at the maximum line voltage of 135 rms) or a minimum of 175 different increments (for the minimum line voltage specification of 110 volts rms). In this manner, the speed requirements of the A/D converter are reduced which minimizes the cost of the meter apparatus 80 and yet acceptable accuracy in the measurement of average power consumed in each ¼th second is maintained.

As shown in FIG. 4, the circuitry required to increment the reference level voltages includes counter 210, NAND gates 230, 232, 234, and 236, NOR gate 238, and flip-flop 240. The outputs of the four-bit counter 210 are connected to the four least significant inputs of the D/A converter 208 and provide a maximum of sixteen different values within the values established by the four most significant bit inputs of the D/A converter 208. The outputs of counter 210 are also connected as inputs to NAND gate 230 and NOR gate 238 which respectively determine when a maximum or minimum count has been reached and through flip-flop 240 reverses or changes the direction of count pulses to counter 210. The non-inverting and inverting outputs of flip-flop 240 are inputs to NAND gates 234 and 236, respectively. The control signal 106A, which is the output of flip-flop 180 in FIG. 3, is also an input to NAND gates 234 and 236 and is at a high or logic one state when the magnitude of the first input signal 86 is decreasing with respect to time, and at a logic zero state when the magnitude of the first input signal 86 is increasing with respect to time. Thus, the positive going edge of the control signal 106A, as control signal 106A switches from a logic zero to a logic one state, provides the positive peak detection of the first input signal 86. When the first input signal 86 reaches a positive peak, control signal 106A will switch to a logic one state which causes the outputs 242 or 244 of NAND gates 236 or 234, respectively, to switch to a logic zero state which increments or decrements counter 210 to adjust the reference level voltages accordingly.

Figure 6:
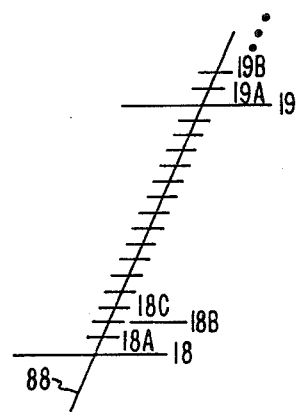
FIG. 6 is a waveform illustrating the operation of the reference level generator of FIG. 4.

The incrementing of the reference level voltages between successive cycles of the first input signal 86 is more clearly illustrated in FIG. 6 which depicts, for example purposes, a portion of the first input signal 86 waveform and two successive reference level voltages 18 and 19. Without the incrementing of the reference level voltages as described above, the magnitude of the reference level voltages 18 and 19 will remain the same between succeeding cycles of the first input signal 86. During the first cycle of the first input signal 86, a particular reference level voltage would have a magnitude indicated by reference number 18. When the magnitude of the first input signal 86 reaches a positive peak, counter 210, shown in FIG. 4, would be incremented as described above, which in turn increments the least significant bits of the inputs to the D/A converter 208 by one and causes the magnitude of the particular reference level voltage 18 to be adjusted by 1/16th of the voltage difference between successive reference levels to a new magnitude indicated by reference number 18A. Throughout the remainder of the particular cycle of the first input signal 86, subsequent reference level voltages, such as reference level voltage 19, will similarly be adjuted by 1/16th of the voltage difference between successive reference level voltages to provide new magnitudes as indicated by reference number 19A. The next time the magnitude of the first input signal 86 reaches a positive peak, counter 210 will be incremented again which adjusts the reference level voltages by another increment to a new level indicated by reference numbers 18A and 19B. This procedure is repeated over sixteen cycles of the first input signal 86 to provide an optimization of the sampling of the current input signal 88 which enables the speed requirements of the A/D converter to be reduced without decreasing the accuracy of measuring a parameter of electrical energy.

Figure 7:
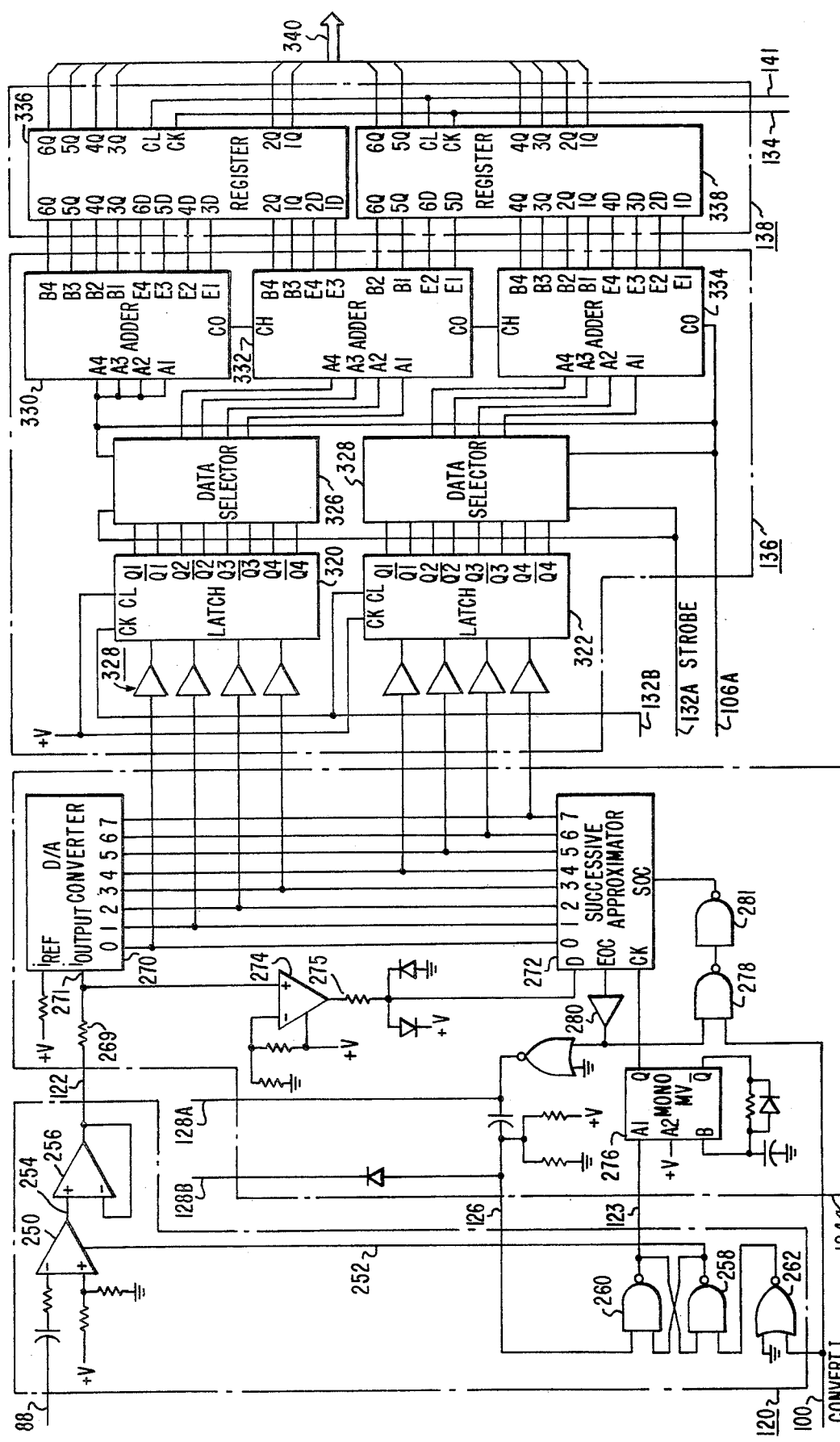
FIG. 7 is a schematic circuit diagram of the sample and hold, A/D conversion, adder and register circuits shown in FIG. 2.

Referring now to FIG. 7, there is shown the sample and hold circuitry 120, A/D converter logic 124, adder/subtracter circuitry 136 and registers 138 which sample the instantaneous magnitude of the second or current input signal 88, convert the instantaneous magnitude to digital signal representations thereof and either add or subtract successive digital signal representations from previously stored values.

The sample and hold circuitry 120 includes sample and hold amplifier 250 which has inverting (−) input terminal connected to the current input signal 88 received from amplifier 85 shown in FIG. 2. The non-inverting (+) input terminal of amplifier 250 is connected through a resistor to a positive potential to offset the output of amplifier 250 such that the output voltage swings from zero to a positive magnitude. Control line 252 is connected to the sample input of amplifier 250, and when switched to a high or logic one state, causes amplifier 250 to sample the current input signal 88 and provde an output 254 which is instantaneous magnitude of the current input signal 88 at the sampling instant to the non-inverting (+) input terminal of operational amplifier 256. Operational amplifier 256, which has its output connected in feedback relation to its inverting (−) input terminal provides an output signal on control line 122 to the A/D converter logic 124 which is the instantaneous magnitude of the current input signal 88 at the sampling instant. Control signal 252 is the output of NAND gate 258 which is connected in flip-flop relationship with NAND gate 260. NAND gate 260 has, as one of its inputs, control signal 126 from the end of conversion (EOC) output of the successive approximator 272 in the A/D converter logic 124; while NAND gate 258 receives at one of its inputs, the CONVERT I signal 100 through NOR gate 262. This flip-flop arrangement of NAND gates 258 and 260 ensures that a subsequent CONVERT I command 100 does not cause a new instantaneous magnitude of the current or second input signal 88 to be sampled before the preceding instantaneous magnitude of the current or second input signal 88 has been converted into digital form. Assuming, for example purposes, that the preceding instantaneous magnitude of the current signal 88 has been completely converted into digital form, the CONVERT I control signal 100, which is generated by multivibrator 174 whenever the magnitude of the first input signal 86 crosses one of the reference level voltages, will cause the output 252 of NAND gate 258 to switch to a high or logic one state thereby enabling the sampling amplifier 250 to sample the current input signal 88 and provide on its output 254 thereof, the instantaneous magnitude of the current or second input signal 88 at the sampling instant.

The instantaneous magnitude of the current input signal 88, which is the output 122 of operational amplifier 256, is inputted to the A/D converter logic 124. The A/D converter logic 124 includes a D/A converter 270, such as Model No. MC1408, an eight-bit successive approximation analog-to-digital converter, such as Model No. MC14559 marketed by Motorola Semiconductor Products, Inc., Phoenix, Arizona, comparator 274 and suitable timing circuitry to operate the components in the manner described below. A monostable multivibrator 276 has its A1 input connected to the output of flip-flop 260 in the sample and hold circuitry 120. Flip-flop 260 switches to a low or logic zero state when the CONVERT I signal 100 is generated by multivibrator 174 in the enable logic 98 thereby triggering the multivibrator 276 which generates a series of pulses to the clock input of the successive approximator 272. The CONVERT I control signal 100 along with the end of conversion (EOC) signal from amplifier 280 are inputs to NAND gate 278, the output of which, through NAND gate 281, is connected to the start of conversion input (SOC) of the successive approximator 272 and, when switched to a high or logic one state, initiates the start of conversion of the instantaneous magnitude of the sampled current input signal 88 into digital form, as shown in the waveforms in FIG. 5.

The D/A converter 270 provides an output current at its output terminal 271 which is the product of a fraction formed of an eight-bit digital word received at its inputs from the successive approximator 272 divided by the full range of the converter 270 and a reference current present at its $i_{ref}$ input. The output 122 of the operational amplifier 256, which is the instantaneous magnitude of the sampled current input signal 88, is converted to a current signal by resistor 269 and summed with the output current signal 271 Afrom D/A converter 270 at the non-inverting (+) input terminal of comparator 274. Comparator 274 has its inverting terminal (−) connected to a resistor to ground to provide a suitable biasing signal which is compared with the combined input signal from operational amplifier 256 and the D/A converter 270. Comparator 274 thus provides an output 275 to the data input (D) of the successive approximator 272 which is proportional to the difference between the inputs connected thereto. As shown in the waveforms depicted in FIG. 5, the CONVERT I control signal 100, which is generated whenever the magnitude of the ∫edt or first input signal 86 exceeds one of reference level voltages, activates the sample and hold circuitry, as described above, to provide the instantaneous magnitude of the current input signal 88 at the output 122 of operational amplifier 256 and, further, initiates the start of conversion of the instantaneous magnitude of the sampled current input signal 88 into digital form.

Referring again to FIG. 7, the generation of the start of conversion sequence causes the most significant bit, bit zero, in the successive approximator 272 to be temporarily set to a "one" state. The eight-bit digital output of the successive approximator 272 is received at the inputs of the D/A converter 270 which generates an output current signal 271 as described above. This current output signal 271 is summed with the current signal proportional to the instantaneous magnitude of the sampled current or second input signal 88 and compared by comparator 274. The output 275 of comparator 274 thus indicates whether the eight-bit digital output of the successive approximator 272 is greater or less than the sampled instantaneous magnitude of the current or second input signal 88 and causes the most significant bit, bit zero, of the successive approximator 272 to remain in a "one" state or to be reset to a "zero" state depending upon the relative magnitude of the inputs to the comparator 274. This process is repeated on succeeding clock pulses for each of the remaining bits of the successive approximator until a complete eight-bit digital word is present on the outputs of the successive approximator 272 which is equivalent to the instantaneous magnitude of the sampled current or second input signal 88. At this time, the successive approximator generates an end of conversion signal (EOC) which resets multivibrator 276 as well as flip-flop 260 in the sample and hold circuitry 120, as described above.

Figure 8:
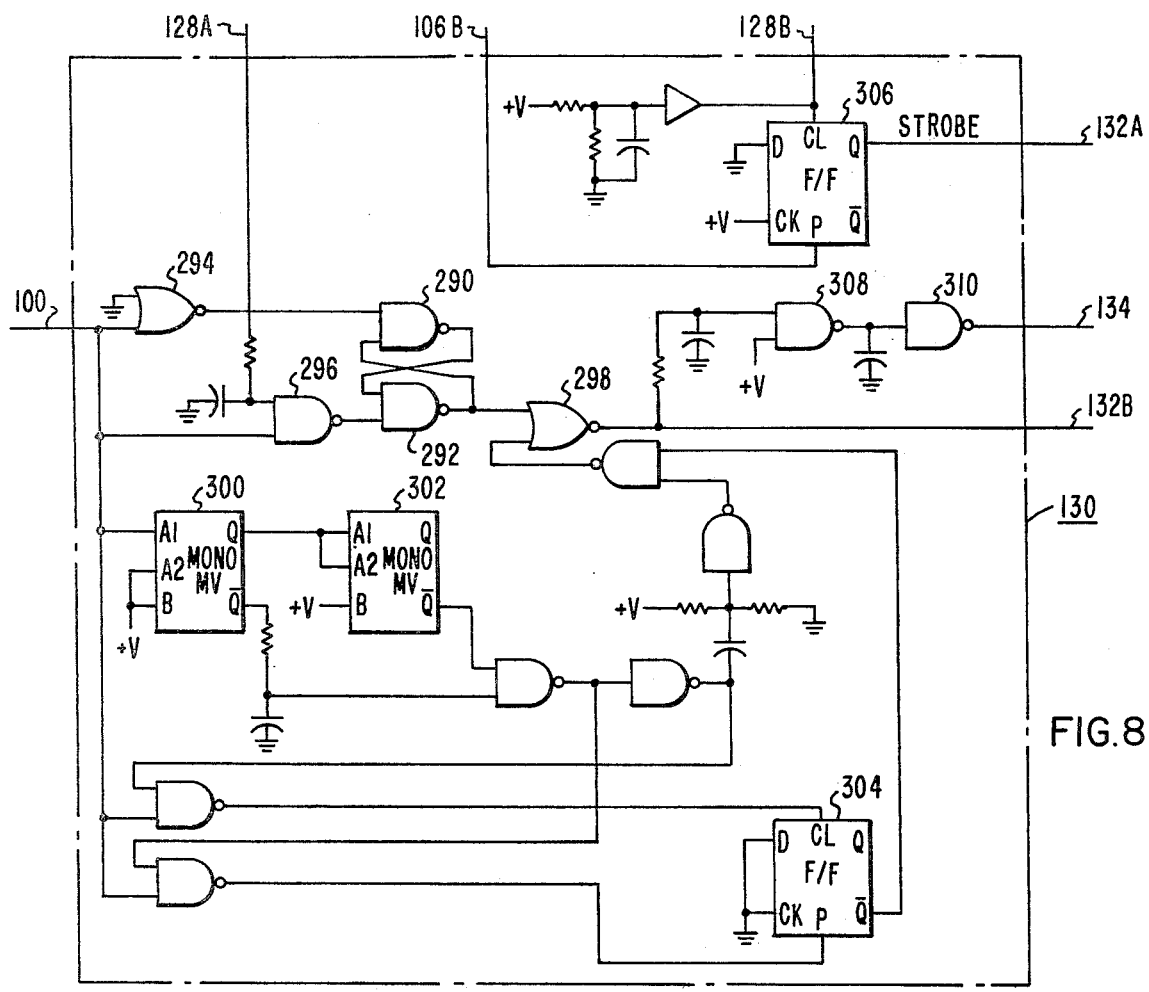
FIG. 8 is a schematic circuit diagram of the control logic circuit shown in FIG. 2.

The data word, which may be in binary form, present on the outputs of the successive approximator 272 at the completion of a conversion sequence is transferred to the adder/subtracter logic 136 under the control of control signals generated by the control logic 130. The control logic circuitry, as shown in FIG. 8, includes NAND gates 290 and 292 which are connected in flip-flop arrangement and respectively receive the output of NOR gate 294 which has the CONVERT I control signal 100 as its input and NAND 296 which has as its inputs the CONVERT I control signal 100 and control signal 128A from the end of conversion output terminal of the successive approximator 272, shown in FIG. 7. Flip-flops 290 and 292 interact to retain the sequence of the CONVERT I control signal 100 and the end of conversion (EOC) signal and provide an appropriate output to NOR 298 at the completion of the conversion of the instantaneous magnitude of the current or second input signal 88 into digital form. Monostable multivibrators 300 and 302 interact with appropriate gates and flip-flop 304 to provide an input to NOR gate 298 after a suitable time delay.

The output 132B of NOR 298, which is connected to the clock input of four-bit latches 320 and 322 in the adder/subtracter circuitry 136, shown in FIG. 7, serves to clock the eight-bit digital output of the successive approximator 272 through amplifiers 324 into the inputs of the four-bit latches 320 and 322. Upon receiving the clock pulse 132B from the control logic 130, the non-inverting outputs of the four-bit latch elements switch to the state of the data present at their inputs with the inverting outputs assuming the opposite state.

Referring again to FIG. 8, flip-flop 306, having signal 106B from flip-flop 182 in FIG. 3 connected to its preset input and control signal 128A, which is the inverted end of conversion signal (EOC) from the successive approximator 272, shown in FIG. 7, connected to its clear input, generates a control signal 132A, labeled STROBE, upon receiving the inverted end of conversion signal (EOC) from the successive approximator 272. The STROBE signal 132A from flip-flop 306 in the control logic circuitry 130, FIG. 8, clocks the data present on the output of the four-bit latch elements 320 and 322, FIG. 7, into the two:one line data selectors 326 and 328. Control signal 106A from flip-flop 180 in FIG. 3 is an input to the data selectors 326 and 328 and selects whether the inverting or non-inverting outputs of the four-bit latch elements 320 and 322 are used as inputs to the data selectors 326 and 328.

As noted previously, the instantaneous magnitudes of the sampled current or second input signal 88 are added to previously stored values when the $\int e dt$ or first input signal 86 is increasing in magnitude and subtracted when the $\int e dt$ or first input signal 86 is decreasing in magnitude to provide a correct indication of watthours consumed by the load.

During the time the $\int e dt$ input signal 86 is increasing in magnitude, control signal 106A is at a logic zero as shown in FIG. 5. This causes the data word present on the non-inverted or Q1-Q4 outputs of latch elements 320 and 322, in FIG. 7, to be gated through the data selectors 326 and 328 into the A1 through A4 inputs of the four-bit adders 330, 332 and 334. The adders 330, 332 and 334, under the control of control signal 106A, add the data word representing the digitized instantaneous magnitude of the sampled current or second input signal 88 present at the respective A1-A4 inputs to the data word representing previously stored values present on the respective B1-B4 inputs and provide the resultant or new total on outputs E1 through E4, respectively.

When the magnitude of the $\int e dt$ or first input signal 86 is decreasing, control signal 106A is at a logic one which causes the inverted or Q1 through Q4 outputs of each latch element 320 and 322 to be gated through data selectors 326 and 328, respectively, to the A1 through A4 inputs of adders 330, 332 and 334. Since the inverted state of the data word representing the instantaneous magnitude of the current input signal 88 is present at the A1-A4 inputs and a logic one is at the CO input, the adders 330, 332 and 334 effectively subtract the data word present at their inputs from the previously stored values present at the B1 through B4 inputs.

The accumulated or totalized magnitudes of successive one of the sampled current or second input signal 88 are stored in registers 336 and 338, each of which are six-bit latch elements. The 1Q through 6Q outputs of each register 336 and 338 are connected to the B inputs of adders 330, 332 and 334, as shown in FIG. 7. Also, the E1 through E4 outputs of adders 330, 332 and 334 are connected to the 1D through 6D inputs of registers 336 and 338, as shown in FIG. 7. The 1Q through 6Q outputs of registers 336 and 338 will change state to agree with the data present at the respect 1D through 6D inputs under the control of clock signal 134 from NAND gates 308 and 310 and associated resistors and capacitors, as shown in FIG. 8, which is generated by the control logic circuitry 130 a predetermined time interval after the control signal 132A, labeled "STROBE", changes to a logic one state. At the end of each cycle of the first input signal 86 as indicated by a positive peak magnitude, the data stored in registers 336 and 338 is transferred to accumulator 140 (FIG. 9) with the registers 336 and 338 being reset or cleared by control signal 141 which is generated by the accumulator logic, as described hereinafter.

Figure 9:
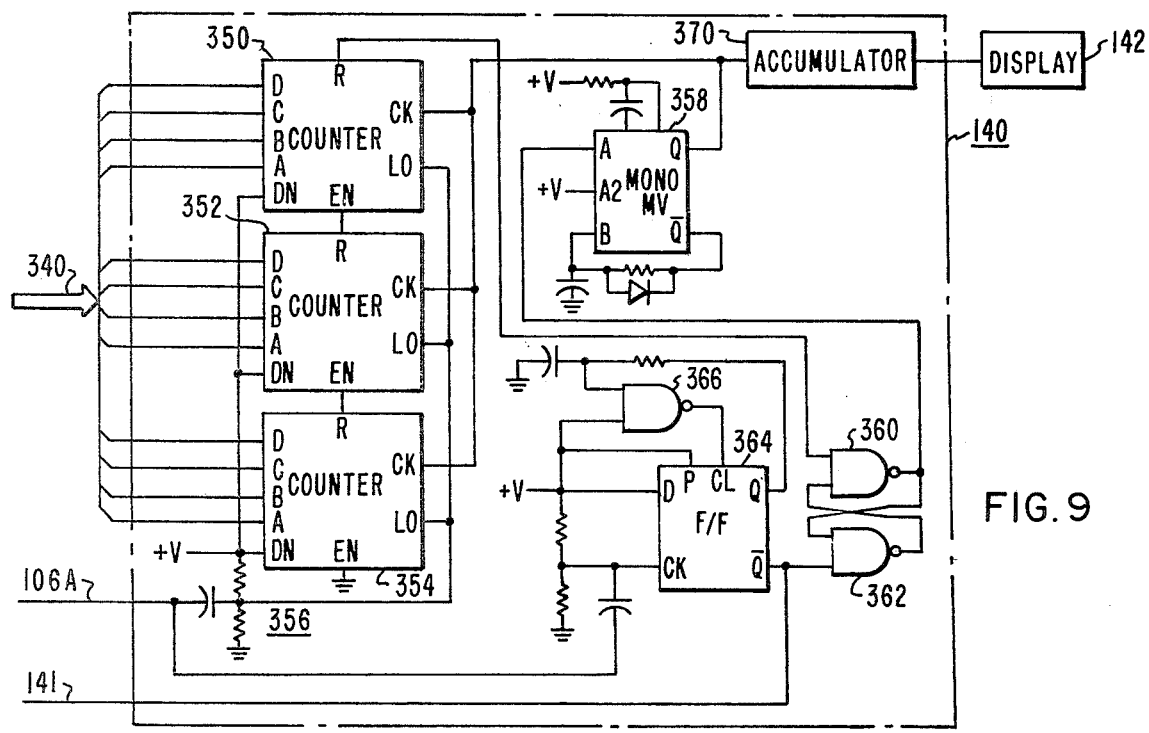
FIG. 9 is a schematic circuit diagram of the accumulator and display circuits shown in FIG. 2.

The outputs of registers 336 and 338 are connected to the input of ripple counters 350, 352 and 354 as generally indicated by reference number 340 in FIGS. 8 and 9. The digital representation of the measured parameter of electrical energy present on data lines 340 will be loaded into counters 350, 352 and 354 under the control of control signal 106A from flip-flop 180, shown in FIG. 3, which is connected to the load input (LO) of each counter 350, 352 and 354. In addition, a resistor and capacitor network 356 provides a time delay after control signal 106A is generated indicating a positive peak detection of the first input signal 86. The counters 350, 352 and 354 have their countdown (DN) inputs connected to a positive potential which enables the counters 350, 352 and 354 to count down on succeeding clock pulses. The clock pulses are generated by monostable multivibrator 358 which has its A1 input connected to the output of NAND gate 360. NAND gate 360 is connected in flip-flop configuration with NAND gate 362 and has as its inputs the ripple output of counter 350 and the output of NAND gate 362. The other input of NAND gate 362 is connected to the inverting output of flip-flop 364. The control signal 106A, which is connected through a capacitor to the clock input of flip-flop 364, causes the inverting output of flip-flop 364 to change states which, in turn, through NAND gates 360 and 362 causes the A1 input of monostable multivibrator 358 to go low thereby triggering the multivibrator 358 and causing it to generate a series of clock pulses. The non-inverting output of flip-flop 364 meanwhile, is connected to the clear input of flip-flop 364 through NAND gate 366 and suitable capacitor and resistor elements which causes flip-flop 364 to be reset after a suitable period of time. The clock pulses from the output of multivibrator 358 are inputted to the clock inputs of the ripple counters 350, 352 and 354 and causes the respective ripple counters 350, 352 and 354 to count down. In addition, the clock pulses from multivibrator 358 are inputted to an accumulator 370, which may be any suitable type of data storage device, such as a counter or magnetic recorder. These clock pulses, which are an indication of a measured parameter of electrical energy, are stored by the accumulator 370 to provide totalized values of the measured parameter of electrical energy over a predetermined period of time. In addition, the totalized value stored in the accumulator 370 may be transferred to a suitable display, such as an electromechanical counter or LED readout device 132 for a visible indication of the measured parameter of electrical energy. When the ripple counters 350, 352 and 354 have counted down to zero from the initial values representative of the measured parameter of electrical energy during a cycle of the first input signal 86, the ripple output 374 of counter 350 will go low which resets the NAND gate 360 and monostable multivibrator 358 thereby stopping the clock pulses generated thereby.

Thus far, the meter apparatus 80 has been described in terms of measuring the watthours of electrical power consumed by a load over a predetermined period of time. The meter apparatus 80 accomplishes this function by sampling a second input signal proportional to the current component at predetermined instants, which are a function of unit changes of the magnitude of the first input signal proportional to the time integral of the voltage component. The instantaneous magnitudes of the current of second input signal are converted to digital signal representations thereof and accumulated over a predetermined period of time to provide a measure of an electrical energy quantity. In order to measure watthours of power consumed, appropriate input devices 82 and 84, shown in FIG. 2, are utilized to respectively provide the time integral of the voltage and the current component signals necessary to measure watthours.

The same concept described above can also be used to measure other parameters of electrical energy, such as $E^2$ hours, $I^2$ hours, and VAR hours, with only the input circuitry being changed as needed.

Figure 10:
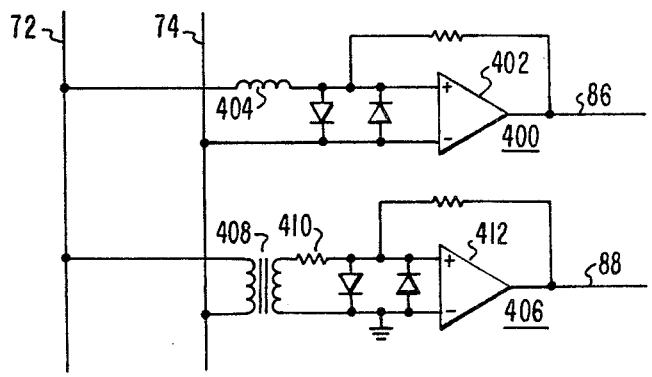
FIG. 10 is a schematic circuit diagram of an input circuit constructed according to another embodiment of this invention.

Referring now to FIG. 10, there is shown input circuits 400 and 406 which respectively provide the $\int edt$ and e input signals necessary to compute $E^2$ hours. Input current 400 is identical to input circuit 82, shown in FIG. 2, and includes a current amplifier 402 having its non-inverting (+) input connected through an inductor 404 to distribution network conductor 72 and its inverting input (−) connected to conductor 74. Amplifier 402 provides at its output a signal 86 whose voltage is proportional to $\int edt$. Input circuit 406 includes a potential transformer 408 connected across conductors 72 and 74 of the distribution network. The voltage on the secondary winding of transformer 408 is converted to a current by resistor 410 and applied to the non-inverting (+) input of amplifier 412. The inverting input (−) of amplifier 412 is connected to the other end of secondary winding of transformer 408 to complete the circuit. The output of amplifier 412 is a signal 88 whose voltage is proportional to e or the voltage across the distribution conductors 72 and 74. The $\int edt$ and e or first and second input signals 86 and 88, respectively, are processed by the meter apparatus 80 in the same manner as the $\int edt$ and current signals associated with the measurement of watthours to provide a measure of $E^2$ hours over a period of time.

Figure 11:
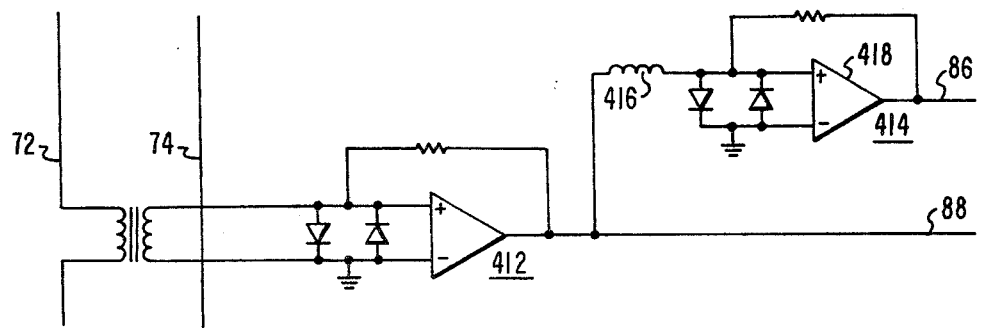
FIG. 11 is a schematic circuit diagram of an input circuit constructed according to another embodiment of this invention.

FIG. 11 illustrates the input circuits 412 and 414 required to measure $I^2$ hours. Since input circuit 412 is identical to input circuit 84, shown in FIG. 2, it will not be described in detail below. The output of input circuit 412 is a signal 88 whose voltage is proportional to the current drawn by the load 78. The current or second input signal 88 is also input to input circuit 414 and is connected through inductor 416 to the non-inverting (+) input of amplifier 418 which provides the first input signal 86 at the output thereof proportional to the $\int idt$. With these inputs, the meter apparatus 80 effectively computes $I^2$ hours.

Figure 12:
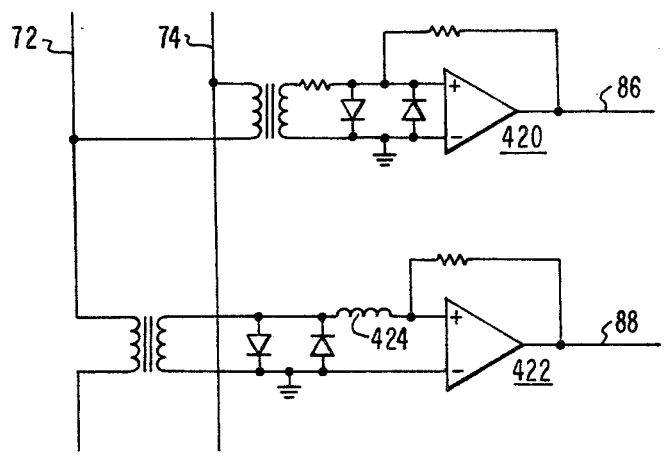
FIG. 12 is a schematic circuit diagram of an input circuit constructed according to another embodiment of this invention.

FIG. 12 depicts the input circuits required to measure VAR or reactive e times hours over a period of time. Input circuit 420 is identical to input circuit 406, shown in FIG. 10, and provides an output which is the first output signal 86 whose voltage is proportional to the voltage across distribution conductors 72 and 74. Input circuit 422 is similar to input circuit 412, shown in FIG. 11. The voltage of the output signal 88 from input circuit 422 is proportional to current drawn by the load. In this manner, the meter apparatus 80 provides a measure of VAR hours similar to that provided by a conventional electro-mechanical VAR meter.

In summary, there has been disclosed a novel method and meter apparatus for measuring parameters of electrical energy quantities occurring in an electrical power distribution system. The meter apparatus samples a second input signal, which is proportional to one of the voltage and current components of an electrical energy quantity, at predetermined instants, which are a function of unit changes in the magnitude of the time integral of a first input signal, which is proportional to one of the voltage and current components of the electrical energy quantity, to provide instantaneous values of said second input signal. Successive ones of the instantaneous magnitudes of the second input signal are converted to digital signal representations and accumulated to provide totalized values which are equivalent to the time integral of the product of the ones of the voltage and current components represented by first and second signals over a predetermined period of time and which are proportional to a measured parameter occurring on the electrical distribution system. What is claimed is:

1. Meter apparatus for measuring a parameter of an electrical energy quantity occurring in an electrical power distribution system comprising:
   input means for generating first and second input signals representative of certain ones of the voltage and current components of said electrical energy quantity occurring on said electrical power distribution system, with said first input signal being proportional to the time integral of one of said voltage and current components and said second input signal being directly proportional to one of said voltage and current components:
   means for sampling said second input signal at predetermined instants, which are a function of unit changes in the magnitude of said first input signal, said sampling means providing the instantaneous magnitude of said second input signal at each of said predetermined instants;
   means, responsive to said sampling means, for generating signal representations of said instantaneous magnitudes of said second input signal;
   accumulator means for accumulating successive ones of said signal representations, said accumulator means providing totalized values which are proportional to the time integral of the product of said certain ones of the components being represented by said first and second input signals over a predetermined period of time; and
   output means, responsive to said totalized values, for providing data output signals representative of the measured parameter of electrical energy quantity.

2. The meter apparatus of claim 1 wherein said signal representations are digital signals being generated by the means responsive to said sampling means.

3. The meter apparatus of claim 1 including means for detecting unit changes in the magnitude of the first input signal.

4. The meter apparatus of claim 3 including means for varying the magnitude from which each unit change in the magnitude of the first input signal is measured at predetermined intervals to optimize the sampling of the second input signal over a predetermined period of time.

5. The meter apparatus of claim 4 wherein the predetermined interval of varying the magnitude of the unit change is once per cycle of the first input signal.

6. The meter apparatus of claim 1 wherein the accumulator means includes:
   means for adding successive ones of the signal representations of the second input signal to previously accumulated values during the time the magnitude of the first input signal is increasing; and
   means for subtracting successive ones of the signal representations of said second input signal from previously accumulated values during the time the magnitude of said first input signal is decreasing to provide an accurate measurement of a parameter of an electrical energy quantity.

7. The meter apparatus of claim 1 wherein the first input signal is proportional to the time integral of e, where e is proportional to the voltage on the electrical distribution system, and the second input signal is proportional to the current drawn by a load on said distribution system and the measured parameter of electrical energy quantity is the watthours of electrical energy consumed by said load over a predetermined period of time.

8. The meter apparatus of claim 3 wherein the detecting means includes:
   means for successively generating reference level voltages associated with the entire magnitude range of the first input signal, each of said reference level voltages being a constant unit of magnitude different from the preceding reference level voltage; and
   means for determining when the instantaneous magnitudes of the first input signal crosses the magnitude of one of said reference level voltages, with the sampling means being responsive to said determining means to sample the second input signal at the instant said first input signal crosses the magnitude of one of said reference level voltages.

9. The meter apparatus of claim 8 wherein the reference level generating means includes means for generating successive reference level voltages which are the predetermined unit of magnitude greater than preceding reference level voltages when the magnitude of the first input signal is increasing with respect to time and which are the predetermined unit of magnitude less than preceding reference level voltages when the magnitude of the first input signal is decreasing with respect to time such that the magnitude of the present one of said reference level voltages constantly follows the magnitude of said first input signal.

10. The meter apparatus of claim 8 including means for varying the magnitude of corresponding ones of the reference level voltages by a predetermined amount at predetermined intervals to optimize the sampling of the second input signal over a predetermined period of time.

11. The meter apparatus of claim 10 wherein the predetermined interval is once per cycle of the first input signal.

12. The meter apparatus of claim 8 wherein:
   the reference level generating means generates first and second reference level voltages at one time, said first and second reference level voltages having the predetermined unit of magnitude difference therebetween such that one of said first and second reference level voltages is greater than the instantaneous magnitude of the first input signal and the other of said first and second reference level voltages is less than the instantaneous magnitude of said first input signal.

13. The meter apparatus of claim 12 wherein the reference level generating means includes means responsive to the determining means, for generating third and fourth reference level voltages when the magnitude of the first input signal crosses the magnitude of one of the first and second reference level voltages, with said third and fourth reference level voltages having the predetermined unit of magnitude, difference therebetween and, further, having magnitudes which are said predetermined unit of magnitude difference from the magnitudes of said first and second reference level voltages, respectively.

14. A method of measuring a parameter of an electrical energy quantity occurring in an alternating current electrical distribution system comprising the steps of:
   providing first and second input signals representative of certain ones of the voltage and current components occurring in said electrical distribution system, with said first input signal being proportional to the time integral of one of said voltage and current components and said second input signal being directly proportional to one of said voltage and current components;
   sampling said second input signal at predetermined instants, which are a function of unit changes in the magnitude of said first input signal, to provide instantaneous magnitudes of said second input signal at each of said predetermined instants;
   generating signal representations of said instantaneous magnitudes of said second input signal at each of said predetermined instants; and
   totalizing successive ones of said signal representations of said second input signal to provide totalized values which are equivalent to the time integral of the product of said certain ones of the components being represented by said first and second input signals over a predetermined period of time in order to measure a parameter of electrical energy quantity occurring in said electrical distribution system.

15. The method of claim 14 further including the step of detecting unit changes in the magnitude of the first input signal.

16. The method of claim 14 wherein the step of accumulating successive ones of the signal representations of the second input signals includes the steps of:
   adding successive ones of said signal representations of said second input signal to previously accumulated values during the time the magnitude of the first input signal is increasing; and
   subtracting successive ones of said signal representations of said second input signal from previously accumulated values during the time the magnitude of said first input signal is decreasing.

17. The method of claim 15 wherein the step of detecting unit changes in the magnitude of the first input signal includes the steps of:
   generating successive reference level voltages, each having a constant unit of magnitude difference therebetween, associated with the entire magnitude range of said first input signal; and
   determining when the magnitude of said first input signal crosses the magnitude of one of said reference level voltages to initiate the sampling of the second input signal.

18. The method of claim 17 further including the step of varying the magnitude of corresponding ones of the reference level voltages at predetermined intervals of the first input signal to optimize the sampling of the second input signal over a predetermined period of time.

19. Meter apparatus for measuring a parameter of an electrical energy quantity occurring in an electrical power distribution system comprising:
   input means for generating first and second input signals representative of certain ones of the voltage and current components of said electrical energy quantity occurring on said electrical power distribution system, with said first input signal being proportional to the time integral of time varying values of one of said voltage and current components and said second input signal being directly proportional to time varying values of one of said voltage and current components;

means for sampling said second input signal at predetermined instants, the occurrence of each predetermined sampling instant being a function of unit changes in the magnitude of said first input signal, and said sampling means providing sample values of the instantaneous magnitude of said second input signal at each of said predetermined sampling instants;

accumulator means for accumulating totalized values of successive ones of said sample values, said totalized values being proportional to the time integral of the product of said certain ones of the components being represented by said first and second input signals over a predetermined period of time; and output means, responsive to said totalized values, for providing data output signals representative of the measured parameter of electrical energy quantity.

20. Meter apparatus for measuring a parameter of an electrical energy quantity occurring in an electrical power distribution system comprising:

input means for generating first and second input signals representative of the time varying values of certain ones of the voltage and current components of said electrical energy quantity occurring on said electrical power distribution system and wherein one of the first and second input signals is proportional to the time integral of one of said voltage and current components;

means for sampling said second input signal at predetermined instants in response to unit changes in the magnitude of said first input signal, said sampling means providing sample values of the instantaneous magnitude of said second input signal at each of the predetermined sampling instants;

accumulator means for accumulating totalized values of successive ones of said sample values;

means for selectively increasing or decreasing said totalized values of said accumulator means by the amount of the successive sample values occurring at said predetermined sampling instants when the magnitude of said first input signal is increasing or decreasing, respectively, so that said accumulator means produces totalized values being proportional to the time integral of the product of said certain ones of the components being represented by said first and second input signals over a predetermined period of time; and output means, responsive to said totalized values, for providing data output signals representative of the measured parameter of electrical energy quantity.

* * * * *